United States Patent [19]

Subbarao

[11] 4,338,648
[45] Jul. 6, 1982

[54] GAPLESS DISCHARGE COUNTER FOR LIGHTNING ARRESTERS

[75] Inventor: Thallam Subbarao, Castleton, N.Y.

[73] Assignee: General Electric Company, N.Y.

[21] Appl. No.: 205,767

[22] Filed: Nov. 10, 1980

[51] Int. Cl.³ .............................................. H02H 3/22
[52] U.S. Cl. .................................. 361/127; 361/118; 340/647; 340/650; 340/653; 324/72
[58] Field of Search ............... 361/127, 128, 126, 130, 361/117, 120, 131, 111, 118, 119; 315/36; 340/647, 659, 650, 653, 664; 324/72; 313/231.1

[56] References Cited
U.S. PATENT DOCUMENTS

| | | | |
|---|---|---|---|
| 3,414,813 | 12/1968 | Fraser | 324/72 |
| 3,443,223 | 5/1969 | Kennon | 324/72 |
| 3,469,188 | 9/1969 | Hall | 324/72 X |
| 4,112,418 | 9/1978 | Ishikawa et al. | 361/118 X |
| 4,259,666 | 3/1981 | Takahashi et al. | 324/72 X |

Primary Examiner—Patrick R. Salce
Attorney, Agent, or Firm—Robert A. Cahill

[57] ABSTRACT

A discharge counter and arrester current meter employs a zinc oxide disk in combination with a pair of bridge rectifiers to accurately determine surge arrester steady state current and to count the number of discharges occurring through a voltage surge arrester. The discharge counter and meter circuit, connected between the surge arrester and ground, monitors the steady state current by means of an ammeter and records the number of discharges by means of a capacitor, cyclometer coil, and a recorder. The meter circuit and the discharge counter are uniquely protected by a single zinc oxide disk during the discharge of high current surges.

1 Claim, 3 Drawing Figures

GAPLESS DISCHARGE COUNTER FOR LIGHTNING ARRESTERS

BACKGROUND OF THE INVENTION

U.S. Pat. No. 3,469,188 (Hall) describes a circuit for use with lightning arresters to provide a measure of the grading current and leakage current associated with the arresters as well as to count the number of surges occurring through the arresters. The circuit employs a series gapped voltage dependent nonlinear resistor and a second nonlinear resistor in series with a charging capacitor for the operation of a cyclometer.

When zinc oxide varistors are used within the lightning arrester assembly, no gaps are generally required and a steady state leakage current continuously passes through the arresters to ground. Replacing the two Thyrite varistors and the series gap disclosed within the aforementioned U.S. Patent, with a single zinc oxide varistor, allows the leakage current to be read on a similarly arranged meter and also allows the number of surges to be recorded on a similar cyclometer arrangement. One of the problems involved with the discharge counter and grading current measuring means described in the aforementioned U.S. Patent is the occurrence of reverse current effects immediately subsequent to a surge current which often causes the capacitor associated with the cyclometer to discharge before the cyclometer can become activated. Another problem involved with the aforementioned circuit is the erroneous indication of the magnitude of the leakage current, caused by high frequency components in the leakage current through the measuring circuit. These high frequency current components can charge the capacitor sufficiently to drive the meter and give a false indication of the leakage current.

The purpose of the instant invention is to provide a circuit for surge arresters which reliably provides an indication of the leakage current and which accurately records the number of voltage surges through the arresters.

SUMMARY OF THE INVENTION

The invention comprises a discharge counter and leakage current meter circuit which includes a single zinc oxide varistor connected through a first bridge rectifier to a current meter and through a second bridge rectifier to a capacitor shunted cyclometer coil.

DESCRIPTION OF THE PREFERRED EMBODIMENT

Figure 1:
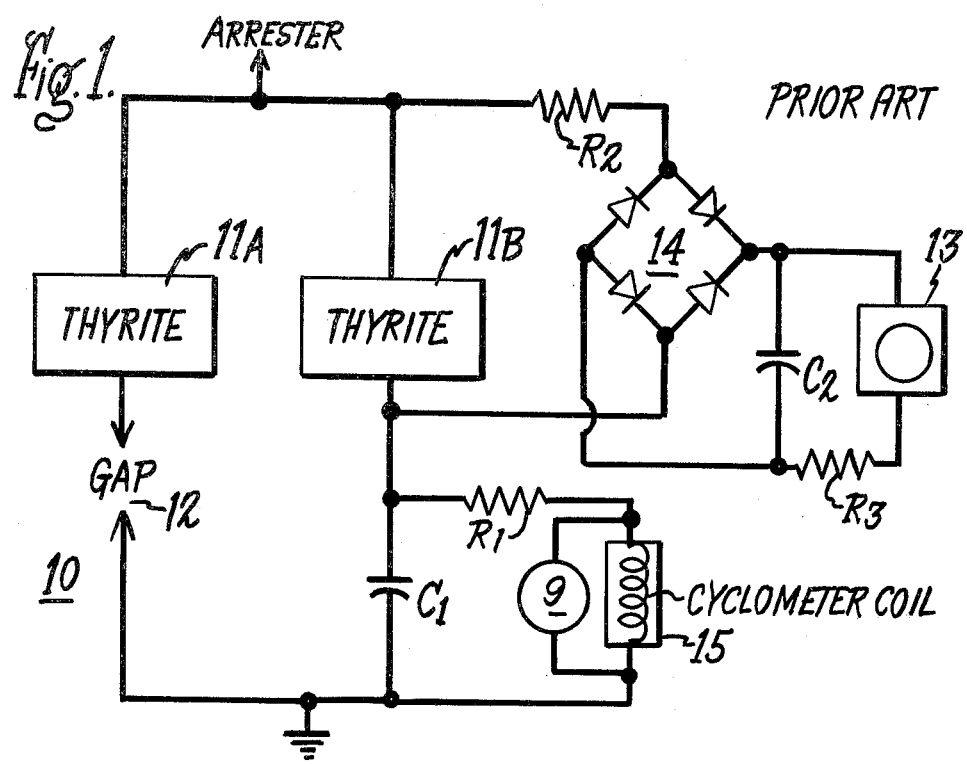
FIG. 1 is a diagrammatic representation of discharge counter and grading current measuring circuit according to the prior art.

The discharge counter and leakage current circuit of the invention can be better understood by referring first to the discharge counter circuit 10 of FIG. 1 wherein a pair of first and second Thyrite (silicon carbide) varistors 11A, 11B, the first of which, 11A is connected to ground through gap 12 and the second of which 11B, is connected by means of a first capacitor $C_1$ and a first resistor $R_1$ to a cyclometer coil 15, and counter 9 which provides an indication as to the number of discharges that occur when circuit 10 is connected between voltage surge arresters and ground. The grading current through the arrester is metered by means of a circuit branch consisting of a second resistor $R_2$, bridge rectifier 14, third resistor $R_3$, and second capacitor $C_2$ connected with an indicating ammeter 13. As discussed earlier, discharges having a current reversal component can cause charging capacitor $C_1$ to discharge before cyclometer coil 15 becomes actuated.

The instant invention improves on the prior art circuit by causing discharge counter 10 to operate correctly in those cases when the surge current has components of both positive and negative polarity. When a surge current flows through the discharge counter circuit 10 of FIG. 1, capacitor $C_1$ will be charged first by means of the principle component of surge current when the principle component of the surge current wave form, which is the first half of the current wave, is of positive polarity, it will flow in the discharge counter circuit 10 of FIG. 1 from the arrester through Thyrite disk 11B, through capacitor $C_1$, and then to ground, thereby charging capacitor $C_1$. Capacitor $C_1$ is protected from overcharging by means of the combination of Thyrite disk 11B, Thyrite disk 11A, and gap 12. Capacitor $C_1$ will hold the charge voltage only if the surge current does not reverse. Since the duration of surge current is only a few microseconds, cyclometer coil 15 cannot be actuated in that short duration of the surge current. When the direction of surge current flow reverses, it will flow from ground, through capacitor $C_1$, Thyrite disk 11B, back to the arrester (not shown). Since the current through capacitor $C_1$ is now opposite to its charge voltage, capacitor $C_1$ will rapidly discharge, and therefore will not actuate cyclometer coil 15 to provide an indication of a voltage surge on counter 9.

Figure 2:
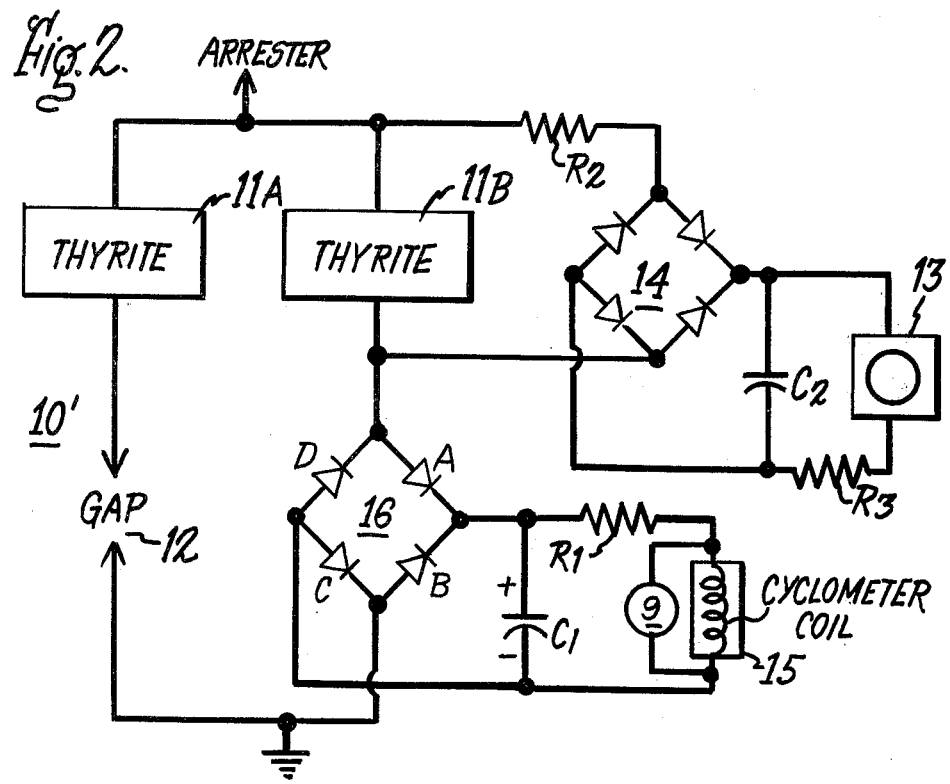
FIG. 2 is a diagrammatic representation of a discharge counter and a leakage current measuring circuit according to the invention.

FIG. 2 contains a discharge counter and leakage current circuit 10' wherein resistor $R_1$, capacitor $C_1$ and cyclometer coil 15 are connected with a second bridge rectifier 16. The addition of bridge rectifier 16 permits capacitor $C_1$ to be charged only in one direction, irrespective of the polarity of the surge current and therefore does not allow any current reversal component to discharge capacitor $C_1$. For the same surge current waveform described earlier wherein the principle component is of positive polarity, the principle component flows from the arrester through Thyrite disk 11B, through diode A of bridge rectifier 16, through the capacitor $C_1$, diode C and then to ground. This current flow charges capacitor $C_1$ with the polarity shown in FIG. 2. As described for the circuit of FIG. 1, capacitor $C_1$ is protected from overcharging by Thyrite disk 11B, Thyrite disk 11A and gap 12. However when the direction of the flow of surge current reverses, current will then flow from ground through diode B, through capacitor $C_1$, through the diode D, through Thyrite disk 11B back to the arrester. It can be seen that although the direction of surge current flow has reversed, the current flow through capacitor $C_1$ is always in the same direction so that capacitor $C_1$ charges during both polarities of the surge current wave. As soon as the surge discharge ceases, capacitor $C_1$ discharges into cyclometer coil 15 and produces one operation of counter 9.

Figure 3:
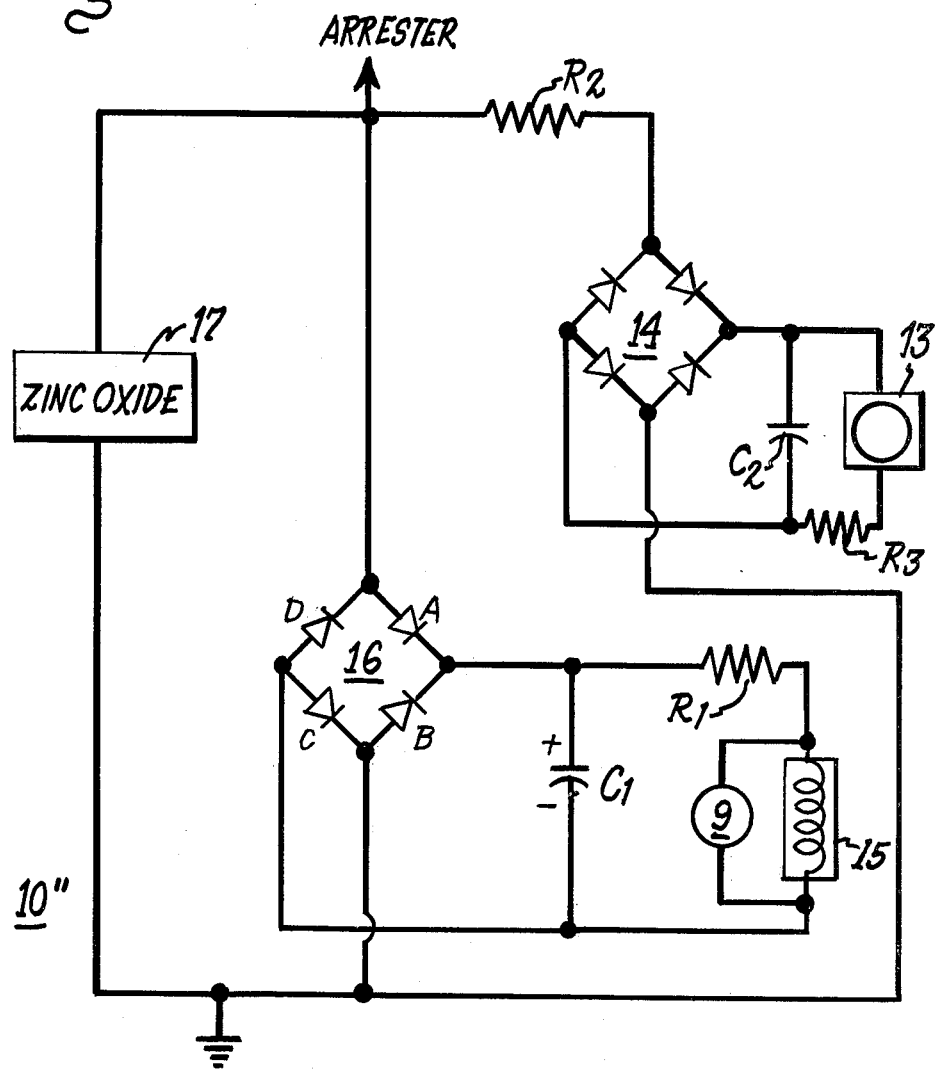
FIG. 3 is a diagrammatic representation of a further embodiment of the discharge counter and leakage current measuring circuit of the invention.

A further embodiment of the discharge counter and leakage current circuit 10'' is shown in FIG. 3 wherein a single zinc oxide varistor 17 is connected between the arrester and ground. Zinc oxide varistor 17 is connected in parallel with capacitor $C_1$ to prevent surge current from damaging capacitor $C_1$, which operates in combination with resistor $R_1$, cyclometer 15, and counter 9 in the manner described earlier. The characteristic of zinc oxide varistor 17 is sufficiently nonlinear so as to not require a series gap to protect the capacitor $C_1$, when surge currents of several thousand amperes are discharged through circuit 10''. Since zinc oxide varistor 16 is able to limit the voltage across it to a reasonably low level under surge current conditions, THyrite 11B, required within circuit 10 of FIG. 1, is also dispensed with.

During normal operating conditions, leakage current through the arrester and capacitor $C_1$ in circuit 10'' is quite small so that zinc oxide disk 17 exhibits a very high resistance so that the leakage current through capacitor $C_1$ therefore develops a low voltage. For a value of $C_1$ equal to 1 $\mu f$, and for a leakage current equal to 5 milliamperes, the voltage across $C_1$ approximates 15 volts. Under surge conditions, the surge current first flows through capacitor $C_1$ causing capacitor $C_1$ to become charged. $C_1$ is now protected by zinc oxide varistor 17 connected directly in parallel. At the end of the surge current flow, capacitor $C_1$ discharges into cyclometer coil 15 through resistor $R_1$, thereby actuating counter 9 to provide an indication of a voltage surge. The addition of rectifier bridge 16 prevents capacitor $C_1$ from discharging when the surge current flow reverses, in the same manner described for circuit 10' of FIG. 2. The leakage and grading current measuring circuit of the invention consisting of second resistor $R_2$, bridge rectifier 14, and ammeter 13 shown in FIG. 3 is directly connected between the arrester and ground. As described earlier for normal conditions, the current flowing through capacitor $C_2$ will develop a voltage across it, which is a function of the leakage current, measured by meter 13. The same zinc oxide varistor 17 that protects capacitor $C_1$ during surge current, also protects meter 13, which is in parallel with zinc oxide varistor 17. Meter 13 is further protected from damage by resistor $R_2$, capacitor $C_2$, and resistor $R_3$.

An advantage of eliminating nonlinear resistor 11B of FIG. 1 connected in series with capacitor $C_1$, and connecting the leakage current measuring portion of the circuit, consisting of $R_2$, bridge 14, $C_2$ and meter 13, directly in parallel with capacitor $C_1$ is the elimination of any false reading on leakage current meter 13 when the arrester leakage current contains high frequency components. High frequency components in the leakage current are presented with a low impedance path through capacitor $C_1$, and hence leakage current meter 13 will only respond to the normal power frequency leakage and grading current of the arrester.

What I claim as new and desire to secure by Letters Patent of the United States is:

1. A discharge counter and leakage current meter circuit for a voltage surge arrester, said circuit comprising, in combination;
    a zinc oxide varistor directly connecting the voltage surge arrester to ground;
    a first rectifying bridge having first and second input terminals and first and second output terminals;
    a first resistor connecting said first input terminal to the junction between the arrester and said varistor, said second input terminal connected directly to ground;
    a first capacitor shunting said first and second output terminals;
    the series combination of a second resistor and an ammeter connected across said first capacitor, said ammeter reading leakage current through the arrester;
    a second rectifying bridge having a third input terminal directly connected to the junction between the arrester and said varistor, a fourth input terminal directly connected to ground, and third and fourth output terminals;
    a second capacitor shunting said third and fourth output terminals; and
    the series combination of a third resistor and a cyclometer coil connected across said second capacitor, said cyclometer coil activating a counter to register the number of discharges through the arrester.

* * * * *